United States Patent
Onishi et al.

(10) Patent No.: US 8,749,605 B2
(45) Date of Patent: Jun. 10, 2014

(54) IMAGE FORMING APPARATUS WITH CONTROL UNIT FOR PREVENTING RIPPLES IN PULSE SIGNAL PRODUCED BY PULSE GENERATING UNIT

(71) Applicant: KYOCERA Document Solutions Inc., Osaka (JP)

(72) Inventors: Kenichi Onishi, Osaka (JP); Okito Ogasahara, Osaka (JP); Naohiro Anan, Osaka (JP); Yasuaki Sakamoto, Osaka (JP)

(73) Assignee: Kyocera Document Solutions Inc. (JP)

( * ) Notice: Subject to any disclaimer, the term of this patent is extended or adjusted under 35 U.S.C. 154(b) by 0 days.

(21) Appl. No.: 13/778,196

(22) Filed: Feb. 27, 2013

(65) Prior Publication Data
US 2013/0222512 A1 Aug. 29, 2013

(30) Foreign Application Priority Data
Feb. 27, 2012 (JP) ................................. 2012-039969

(51) Int. Cl.
  *B41J 2/435* (2006.01)
(52) U.S. Cl.
  USPC ......................................... 347/236; 347/246
(58) Field of Classification Search
  USPC ................. 347/236, 237, 246, 247
  See application file for complete search history.

(56) References Cited

U.S. PATENT DOCUMENTS 5,721,579 A * 2/1998 Ogasawara et al. ........... 347/246

FOREIGN PATENT DOCUMENTS

| JP | 62200412 A | * | 9/1987 | ................ G05F 1/66 |
| JP | 2005-262509 | | 9/2005 | |
| JP | 2009-262344 | | 11/2009 | |
| JP | 2011-25502 | | 2/2011 | |
| JP | 2011025502 A | * | 2/2011 | ................ B41J 2/44 |

* cited by examiner

*Primary Examiner* — Hai C Pham
(74) *Attorney, Agent, or Firm* — Gerald E. Hespos; Michael J. Porco; Matthew T. Hespos (57) ABSTRACT

An image forming apparatus includes a photosensitive body, an exposure unit, a pulse generating unit, a smoothing unit, a drive current generating unit, and a second emitting control unit. The exposure unit includes a light source for emitting a light beam, and causes the light beam emitted from the light source to perform scanning in a main scanning direction, thereby drawing a main scanning line on the photosensitive body. The second emitting control unit causes the light source to emit the light beam, in an APC period of automatically controlling the light quantity of the light beam, by causing the pulse generating unit to generate a pulse signal having a duty ratio of 100 percent, causing the smoothing unit to smooth the pulse signal thereby generating an analog signal, and causing the drive current generating unit to generate a drive current based on the analog signal.

7 Claims, 8 Drawing Sheets

IMAGE FORMING APPARATUS WITH CONTROL UNIT FOR PREVENTING RIPPLES IN PULSE SIGNAL PRODUCED BY PULSE GENERATING UNIT

This application relates to and claims priority from Japanese Patent Application No. 2012-039969, filed on Feb. 27, 2012 in the Japan Patent Office, the entire disclosure of which is incorporated herein by reference.

BACKGROUND

The present disclosure relates to technology of automatically controlling (automatic power control: APC), in a light source which emits a light beam for forming an electrostatic latent image, the light quantity of the light beam emitted from the light source.

Formation of an image based on an electrophotographic system includes a step of forming, on a photosensitive drum, an electrostatic latent image of an image indicated by image data, a step of supplying a toner to the electrostatic latent image and forming a toner image, a step of transferring the toner image to a sheet, and a step of fixing, to the sheet, the toner image that was transferred to the sheet.

In the step of forming the electrostatic latent image, the light beam emitted from the light source by controlling the emission of the light source is deflected with a polygon mirror, and a main scanning line is drawn on the rotating photosensitive drum. As a result of repeating the foregoing processes, an electrostatic latent image is formed on the photosensitive drum.

When the magnitude of the drive current of the light source is fixed upon drawing the main scanning line on the photosensitive drum, the light quantity (or intensity) of the light beam irradiated on the photosensitive drum will differ according to the irradiation position on the photosensitive drum. The reasons for this include the distance between the photosensitive drum and the polygon mirror being different at the center part and the end part of the photosensitive drum (the distance between the polygon mirror and the center part of the photosensitive drum is shorter than the distance between the polygon mirror and the end part of the photosensitive drum), and the optical property of the condenser lens disposed between the polygon mirror and the photosensitive drum.

When the light quantity of the light beam irradiated on the photosensitive drum differs according to the irradiation position on the photosensitive drum, there will be unevenness in the density of the image.

Thus, the magnitude of the drive current of the light source during the main scanning is adjusted so that the light quantity of the light beam irradiated on the photosensitive drum becomes constant on the photosensitive drum. For example, proposed is technology of generating a pulse width modulation (PWM) signal which indicates the light quantity of the light beam to be emitted from the light source, smoothing the PWM signal and generating an analog signal of a magnitude corresponding to the light quantity of the light beam to be emitted from the light source, and adjusting the magnitude of the drive current of the light source based on the analog signal.

The light quantity of the light beam to be emitted from the light source is automatically controlled (APC) based on the signal output by the light-receiving unit that received the light beam. This is because a laser diode that is used as the light source is a semiconductor laser, and the light quantity of the light beam emitted from the light source will differ depending on the temperature, even if the drive current is the same.

When the analog signal is generated by smoothing the PWM signal, ripples are generated in the analog signal in correspondence with the cycle of the PWM signal. As a result of the light quantity of the light beam emitted from the light source fluctuating due to the ripples during the period that the APC is being executed, the APC cannot be executed accurately, and, consequently, there is a possibility that the density of the image may become uneven.

When the circuit for smoothing the PWM signal is a low-pass filter configured from a CR filter, it is possible to prevent the generation of ripples in the analog signal if the time constant of the CR filter is increased. Nevertheless, if the time constant is increased, the response time from the time that the PWM signal is input to the CR filter and the analog signal is emitted will increase, and this will lead to the delay in the control of the light quantity of the light beam. Accordingly, there is a limit in increasing the time constant of the CR filter.

An object of the present disclosure is to provide an image forming apparatus capable of preventing the generation of ripples in the analog signal which is generated by smoothing the pulse signal and serves as a base of the drive current of the light source that emits the light beam upon executing the APC of the light quantity of the light beam for forming an electrostatic latent image.

SUMMARY

The image forming apparatus according to the present disclosure includes a photosensitive body, an exposure unit, a pulse generating unit, a smoothing unit, a drive current generating unit, a first emitting control unit, a second emitting control unit, a light-receiving unit, and a light quantity control unit. The exposure unit includes a light source for emitting a light beam, and causes the light beam emitted from the light source to perform scanning in a main scanning direction, thereby drawing a main scanning line on the photosensitive body. The pulse generating unit generates a cyclic pulse signal. The smoothing unit smoothes the pulse signal generated by the pulse generating unit, thereby generating an analog signal. The drive current generating unit generates a drive current of the light source by using the analog signal generated by the smoothing unit. The first emitting control unit performs first emitting control of causing the light source to emit the light beam, during an effective image period where the main scanning line drawn on the photosensitive body is treated as an effective image, by causing the pulse generating unit to generate the pulse signal indicating a light quantity of the light beam to be emitted by the light source, causing the smoothing unit to smooth the pulse signal thereby generating the analog signal, and causing the drive current generating unit to generate the drive current based on the analog signal. The second emitting control unit performs second emitting control of causing the light source to emit the light beam, in an APC period of automatically controlling the light quantity of the light beam, by causing the pulse generating unit to generate the pulse signal having a duty ratio of 100 percent, causing the smoothing unit to smooth the pulse signal thereby generating the analog signal, and causing the drive current generating unit to generate the drive current based on the analog signal. The light-receiving unit receives the light beam emitted from the light source. The light quantity control unit causes the light quantity of the light beam emitted by the light source to be identical to the light quantity of the light beam which is indicated by the pulse signal generated by the pulse generating unit in the first emitting control, by controlling a magnitude of the drive current generated by the drive current generating unit based on a signal output from the light-receiving unit in the second emitting control.

DETAILED DESCRIPTION

Figure 1:
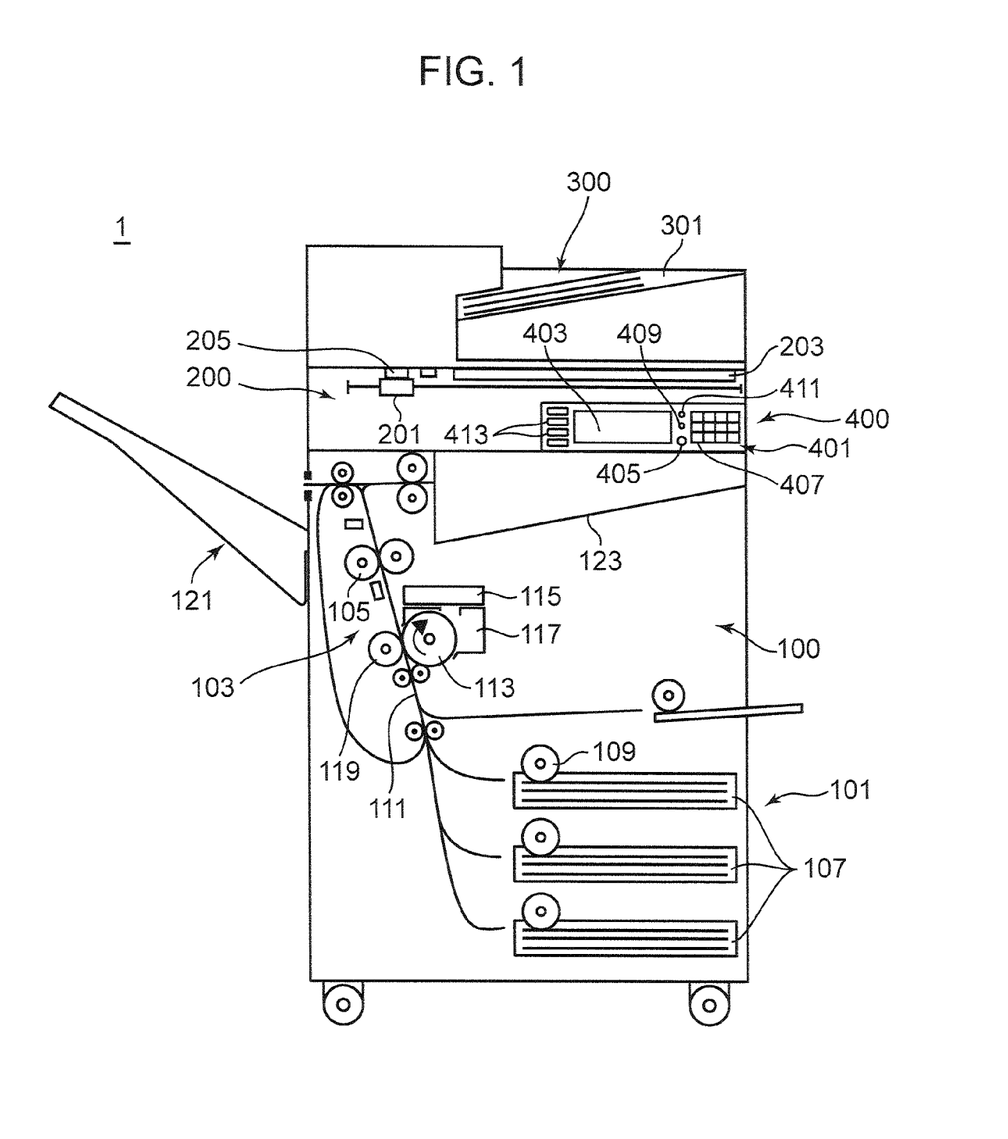
FIG. 1 is a diagram schematically showing the internal structure of the image forming apparatus according to an embodiment of the present disclosure.

Embodiments of the present disclosure are now described in detail with reference to the appended drawings. FIG. 1 is a diagram schematically showing the internal structure of the image forming apparatus 1 according to one embodiment of the present disclosure. The image forming apparatus 1 may be, for example, a multi-function production comprising the functions of a copier, a printer, a scanner, and a facsimile. The image forming apparatus 1 comprises an apparatus body 100, a manuscript reading unit 200 disposed on the apparatus body 100, a manuscript feeding unit 300 disposed on the manuscript reading unit 200, and an operation unit 400 disposed on a front face of a top part of the apparatus body 100.

The manuscript feeding unit 300 functions as an automatic document feeder, and can continuously feed a plurality of manuscripts placed on the manuscript mount part 301 to the manuscript reading unit 200.

The manuscript reading unit 200 comprises a carriage 201 with an exposure lamp and the like mounted thereon, a platen 203 configured from a transparent member such as a glass, a charge coupled device (CCD) sensor not shown and a manuscript reading slit 205. When reading the manuscript plated on the platen 203, the manuscript is read using the CCD sensor while moving the carriage 201 in the longitudinal direction of the platen 203. Meanwhile, when reading the manuscript fed from the manuscript feeding unit 300, the carriage 201 is moved to a position facing the manuscript reading slit 205, and the manuscript sent from the manuscript feeding unit 300 is read by the CCD sensor through the manuscript reading slit 205. The CCD sensor outputs the read manuscript as image data.

The apparatus body 100 comprises a sheet storage unit 101, an image forming unit 103 and a fixing unit 105. The sheet storage unit 101 is disposed at the bottommost part of the apparatus body 100, and comprises a paper tray 107 capable of storing a bundle of sheets. Of the bundle of sheets stored in the paper tray 107, the uppermost sheet is sent toward the paper feeding path 111 based on the drive of the pickup roller 109. The sheet passes through the paper feeding path 111 and is delivered to the image forming unit 103.

The image forming unit 103 forms a toner image on the delivered sheet. The image forming unit 103 comprises a photosensitive drum 113, an exposure unit 115, a developing unit 117 and a transfer unit 119. The exposure unit 115 generates light that is modulated in correspondence to the image data (image data output from the manuscript reading unit 200, image data sent from a PC, image data received by a facsimile, and so on), and the light is irradiated on the peripheral face of the uniformly charged photosensitive drum 113. Consequently, an electrostatic latent image corresponding to the image data is formed on the peripheral face of the photosensitive drum 113. As a result of supplying the toner from the developing unit 117 to the peripheral face of the photosensitive drum 113 in the foregoing state, a toner image corresponding to the image data is formed on the peripheral face. The toner image is transferred, by the transfer unit 119, to the sheet that was delivered from the sheet storage unit 101 explained above.

The sheet to which the toner image was transferred is sent to the fixing unit 105. In the fixing unit 105, heat and pressure are applied to the toner image and the sheet, and the toner image is fixed to the sheet. The sheet is discharged to the stack tray 121 or a discharge tray 123.

The operation unit 400 comprises an operation key unit 401 and a display unit 403. The display unit 403 has a touch panel function, and a screen including soft keys is displayed. As a result of the user operating the soft keys while viewing the screen, the user can perform necessary settings required for executing functions such as copying.

The operation key unit 401 is provided with operation keys configured from hard keys. Specifically, keys such as a start key 405, a numerical keypad 407, a stop key 409, a reset key 411, and a function switch key 413 for switching the copier, printer, scanner and facsimile are provided.

The start key 405 is a key for starting the operation of copying, facsimile transmission, and so on. The numerical keypad 407 is a key for inputting the number of sheets to be copied, facsimile number, and so on. The stop key 409 is a key for discontinuing the copy operation and the like in midcourse. The reset key 411 is a key for returning the set contents to the initial setting.

The function switch key 413 comprises a copy key and a send key, and is a key for mutually switching between the copy function, send function, and the like. When the copy key is operated, the initial screen of copying is displayed on the display unit 403. When the send key is operated, the initial screen of facsimile transmission and email transmission is displayed on the display unit 403.

Figure 2:
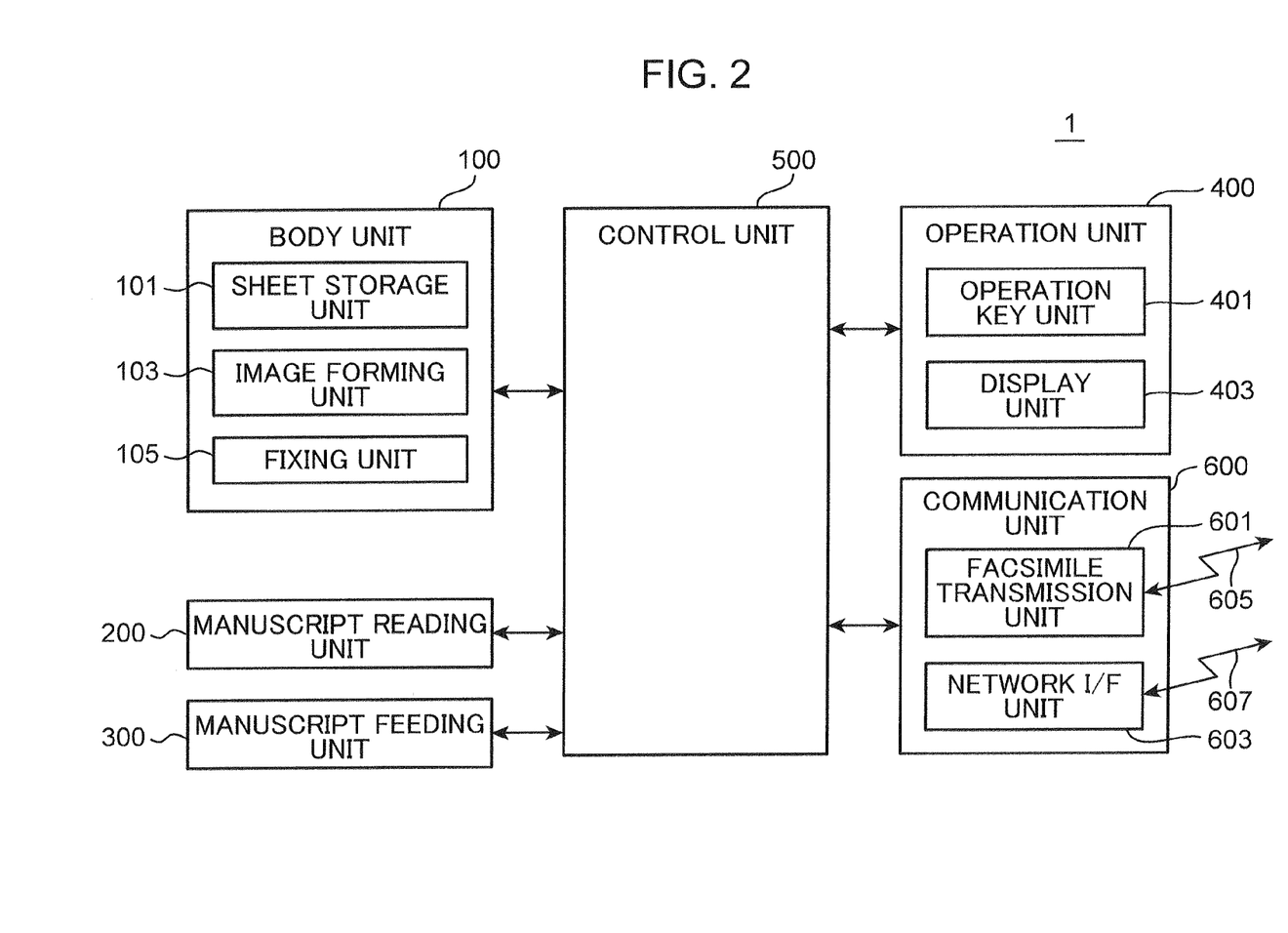
FIG. 2 is a block diagram showing the configuration of the image forming apparatus shown in FIG. 1.

FIG. 2 is a block diagram showing the configuration of the image forming apparatus 1 shown in FIG. 1. The image forming apparatus 1 is configured by an apparatus body 100, a manuscript reading unit 200, a manuscript feeding unit 300, an operation unit 400, a control unit 500 and a communication unit 600 being mutually connected via a bus. Since the apparatus body 100, the manuscript reading unit 200, the manuscript feeding unit 300 and the operation unit 400 have been described above, the explanation thereof is omitted.

The control unit 500 comprises a central processing unit (CPU), a read only memory (ROM), a random access memory (RAM) and an image memory. The CPU executes the control required for operating the image forming apparatus 1 to the foregoing constituent elements of the image forming apparatus 1 such as the apparatus body 100. The ROM stores software required for controlling the operation of the image forming apparatus 1. The RAM is used for temporarily storing data that is generated during the execution of software and storing application software. The image memory temporarily stores image data (image data output from the manuscript reading unit 200, image data sent from a PC, image data received by a facsimile, and so on).

The communication unit 600 comprises a facsimile communication unit 601 and a network I/F unit 603. The facsimile communication unit 601 comprises a network control unit (NCU) for controlling the connection of the other party's facsimile and the telephone line and a modulation/demodulation circuit for modulating and demodulating facsimile communication signals. The facsimile communication unit 601 is connected to a telephone line 605.

The network I/F unit 603 is connected to a local area network (LAN) 607. The network I/F unit 603 is a communication interface circuit for executing communication with a terminal device such as a PC connected to the LAN 607.

Figure 3:
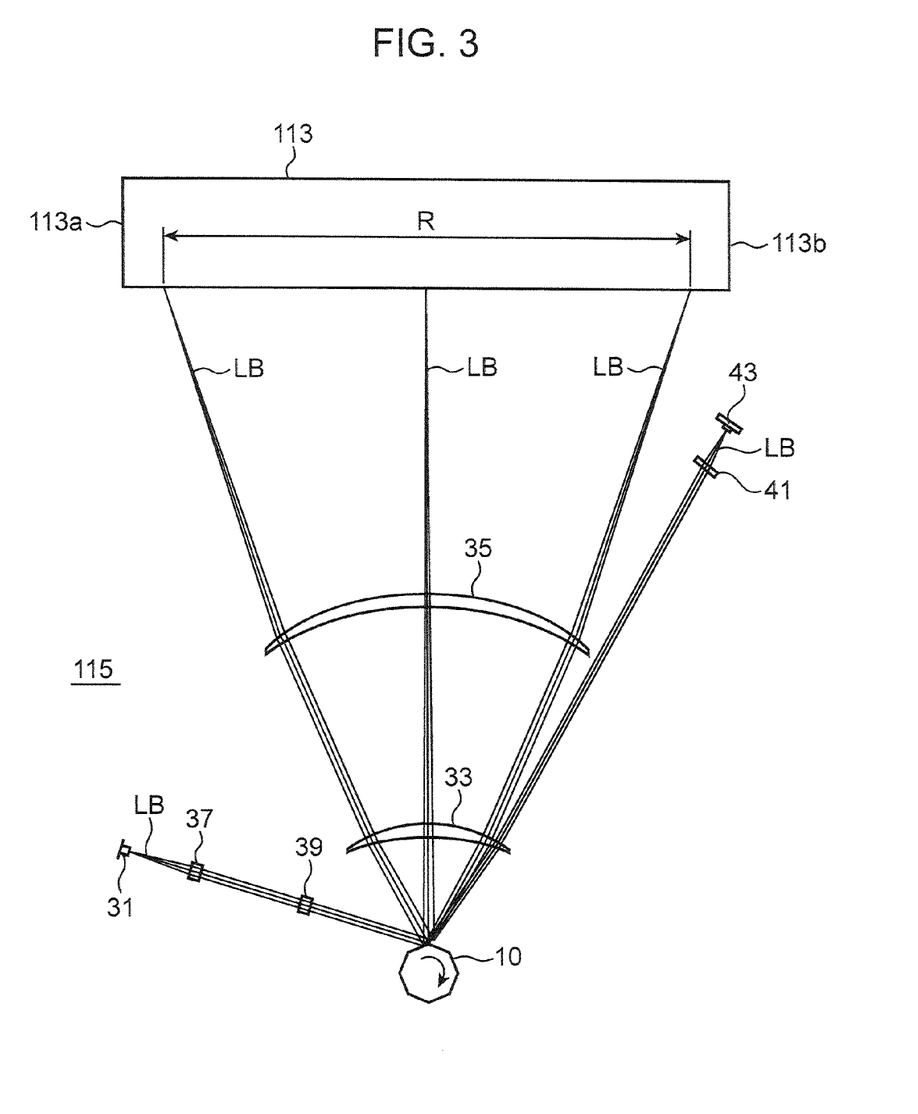
FIG. 3 is a diagram showing the arrangement of the optical components configuring the exposure unit equipped in the image forming apparatus shown in FIG. 1.

The exposure unit 115 is now explained in detail. FIG. 3 is a diagram showing the arrangement of the optical components configuring the exposure unit 115. The exposure unit 115 comprises a light source 31, a polygon mirror 10 and two scanning lenses 33, 35. The light source 31 is, for example, a laser diode (semiconductor laser), and emits a light beam LB.

A collimator lens 37 and a cylindrical lens 39 are disposed on the light path of the light source 31 and the polygon mirror 10. The collimator lens 37 converts the light beam LB emitted from the light source 31 into parallel light. The cylindrical lens 39 linearly condenses the light beam LB that was converted into parallel light. The linearly condensed light beam LB enters the polygon mirror 10.

A scanning lens 33 and a scanning lens 35 are disposed on the light path of the polygon mirror 10 and the photosensitive drum 113. The light beam LB that entered the deflective surface of the polygon mirror 10 is reflected and deflected by that deflective surface, and imaged on the photosensitive drum 113 by the scanning lenses 33, 35. In other words, by causing the light beam LB to scan the photosensitive drum 113, an electrostatic latent image is formed on the photosensitive drum 113.

The exposure unit 115 additionally comprises a beam detect (BD) lens 41 and a BD sensor 43. The light beam LB is caused to scan the photosensitive drum 113 from one side part 113a toward another side part 113b of the photosensitive drum 113, and the light beam LB that exceeds an effective scanning range R is condensed by the BD lens 41 and received by the BD sensor 43. The BD sensor 43 generates a BD signal to become a reference of starting the scanning (main scanning) of the photosensitive drum 113.

As explained above, the exposure unit 115 includes a light source 31 for emitting a light beam LB, and draws a main scanning line on the photosensitive drum 113 (example of a photosensitive body) by causing the light beam LB emitted from the light source 31 to perform scanning in the main scanning direction.

Figure 4:
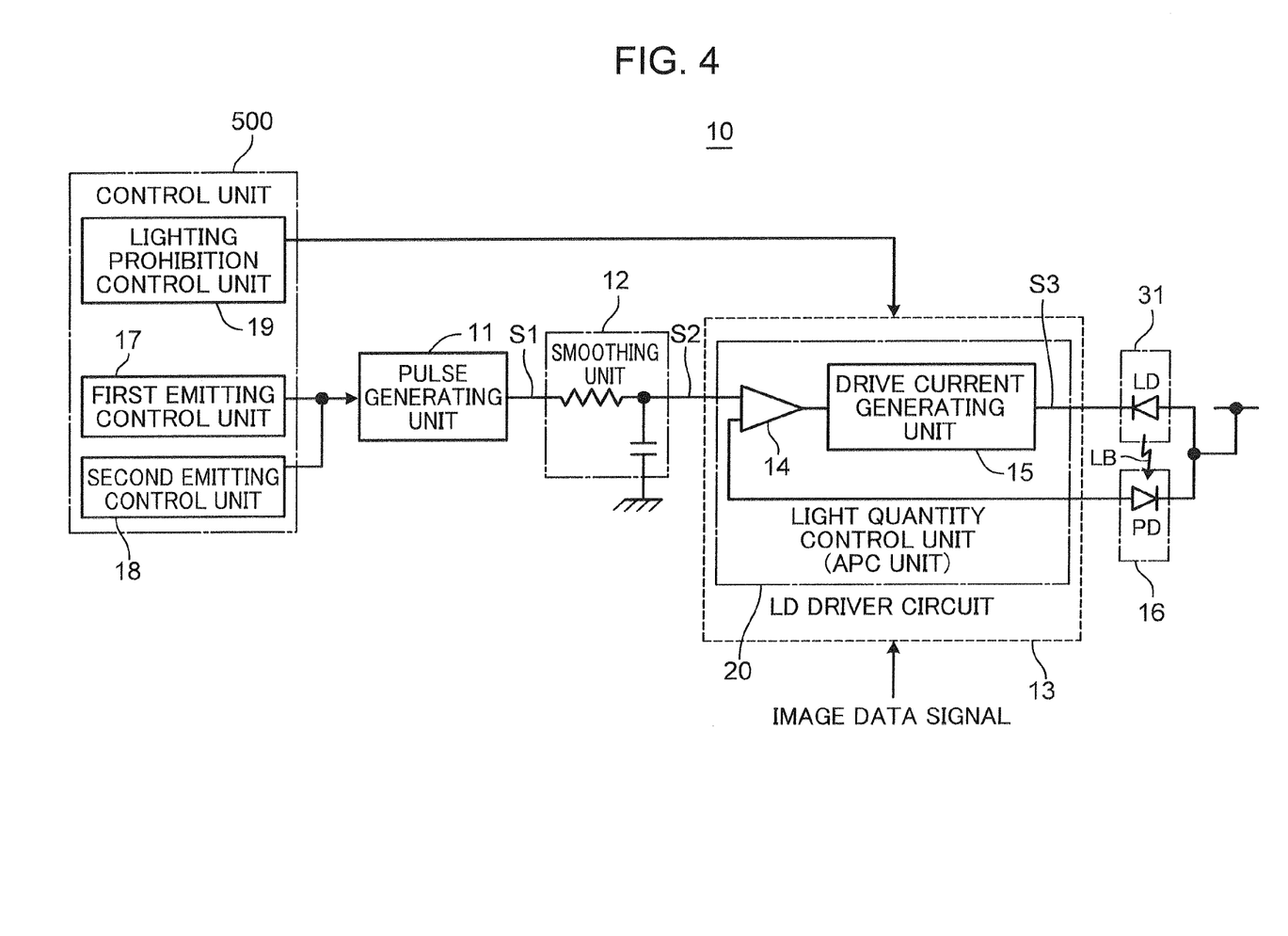
FIG. 4 is a block diagram showing the configuration of the drive current generating system for generating a drive current of the light source.

In this embodiment, the drive current of the light source 31 is generated based on the pulse signal. FIG. 4 is a block diagram showing the configuration of the drive current generating system 10 that generates a drive current S3 of the light source 31. The drive current generating system 10 comprises a pulse generating unit 11, a smoothing unit 12, an LD driver circuit 13, a first emitting control unit 17, a second emitting control unit 18 and a lighting prohibition control unit 19.

The pulse generating unit 11 generates a cyclic pulse signal S1 and, for example, is realized by application specific integrated circuit (ASIC) or field programmable gate array (FPGA). As the cyclic pulse signal S1, for example, a PWM signal or a pulse density modulation (PDM) signal may be used. The PDM signal is a signal in which the density (interval) that the pulse having fixed width is output is variable. In this embodiment, a case is explained where the pulse signal S1 generated by the pulse generating unit 11 is a PWM signal. The light quantity of the light beam LB to be emitted from the light source 31 is indicated with the duty ratio of the PWM signal.

The smoothing unit 12 is configured from a low-pass filter made from a CR filter, smoothes the pulse signal S1 generated by the pulse generating unit 11, thereby generating an analog voltage S2 (analog signal). The analog voltage S2 indicates the light quantity of the light beam LB to be emitted from the light source 31.

The analog voltage S2 is sent to the LD driver circuit 13. An image data signal indicating the image to be printed on the sheet is input to the LD driver circuit 13. The LD driver circuit 13 uses the analog voltage S2 and the image data signal to execute the control of generating the drive current S3 of the light source 31 and the lighting control of the light source 31.

The LD driver circuit 13 comprises a comparing unit 14 and a drive current generating unit 15. The analog voltage S2 generated by the smoothing unit 12 is input to one input unit of the comparing unit 14, and sent to the drive current generating unit 15. The drive current generating unit 15 generates the drive current S3 of the light source 31 by using the analog voltage S2.

The light source 31 is lit by the drive current S3 and emits the light beam LB. In addition to being used for irradiating the photosensitive drum 113, the light beam LB is received by the light-receiving unit 16 configured from a photodiode. The signal output from the light-receiving unit 16 is input to the other input unit of the comparing unit 14.

The anode of the laser diode as the light source 31 is connected to the cathode of the photodiode as the light-receiving unit 16. The anode and the cathode are connected to a power source.

The light quantity control unit 20 (APC unit) is configured from the comparing unit 14 and the drive current generating unit 15. The light quantity control unit 20 automatically controls (APC) the magnitude of the drive current S3 in the APC period so that the light quantity of the light beam LB emitted from the light source 31 in the effective image period is identical to the light quantity of the light beam LB indicated by the pulse signal S1 generated by the pulse generating unit 11.

Here, the effective image period, the lighting prohibition period and the APC period are now explained. The effective image period is a period in which the main scanning line drawn by the photosensitive drum 113 is treated as an effective image. After the lapse of the effective image period, when the light beam LB that was irradiated off from the photosensitive drum 113 and reaches the photosensitive drum 113 upon being diffused in the exposure unit 115, this will adversely affect the electrostatic latent image. Thus, after the lapse of the effective image period, a lighting prohibition period of prohibiting the lighting of the light source 31 is provided. The APC period is a period of automatically controlling the light quantity of the light beam LB so that the light quantity of the light beam LB to be emitted from the light source 31 in the effective image period becomes an intended value.

The first emitting control unit 17, the second emitting control unit 18 and the lighting prohibition control unit 19 are functional blocks that are executed by the control unit 500.

The first emitting control unit 17 performs first emitting control in the effective image period. The first emitting control is the control of causing the light source 31 to emit the light beam LB by causing the pulse generating unit 11 to generate the pulse signal S1 indicating a light quantity of the light beam LB to be emitted by the light source 31, causing the smoothing unit 12 to smooth the pulse signal S1 thereby generating the analog voltage S2, and causing the drive current generating unit 15 to generate the drive current S3 based on the analog voltage S2.

The second emitting control unit 18 performs second emitting control in the APC period. The second emitting control is the control of causing the light source 31 to emit the light beam LB by causing the pulse generating unit 11 to generate the pulse signal S1 having a duty ratio of 100 percent, causing the smoothing unit 12 to smooth the pulse signal S1 thereby generating the analog voltage S2, and causing the drive current generating unit 15 to generate the drive current S3 based on the analog voltage S2. The light quantity control unit 20 controls the magnitude of the drive current S3 to be generated by the drive current generating unit 15 by comparing the signal output from the light-receiving unit 16 and the analog voltage S2 generated by the smoothing unit 12 in the second emitting control (in other words, based on the signal output from the light-receiving unit 16 in the second emitting control). Consequently, in the first emitting control, the automatic control of causing the light quantity of the light beam LB to be emitted from the light source 31 to be identical to the light quantity of the light beam LB indicated by the pulse signal S1 generated by the pulse generating unit 11 is realized.

The lighting prohibition control unit 19 controls the prohibition of the lighting of the light source 31 in the lighting prohibition period between the effective image period and the APC period.

Figure 5:
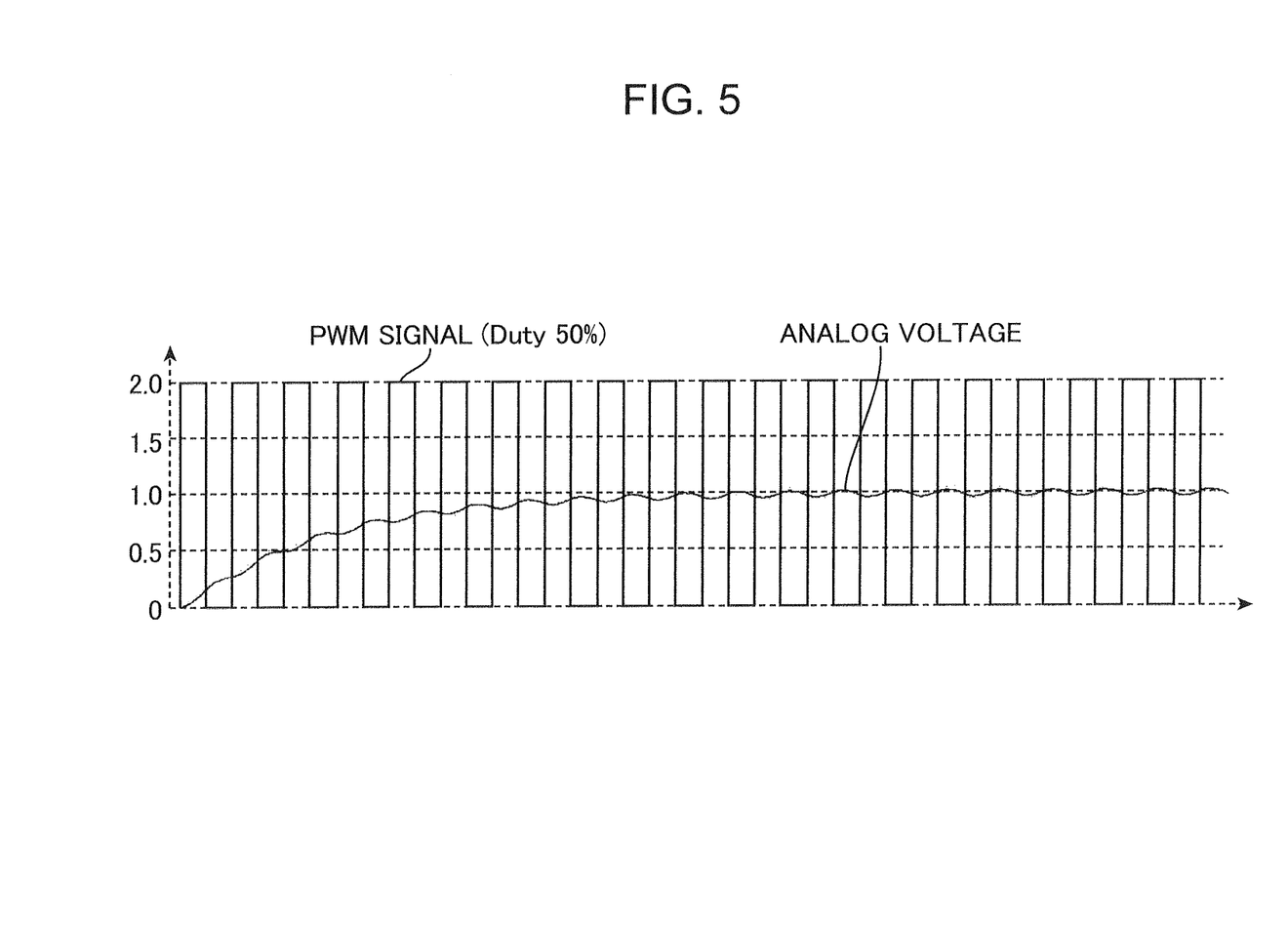
FIG. 5 is a graph showing the relation of the PWM signal, which has a duty ratio of 50%, and the analog voltage.
Figure 6:
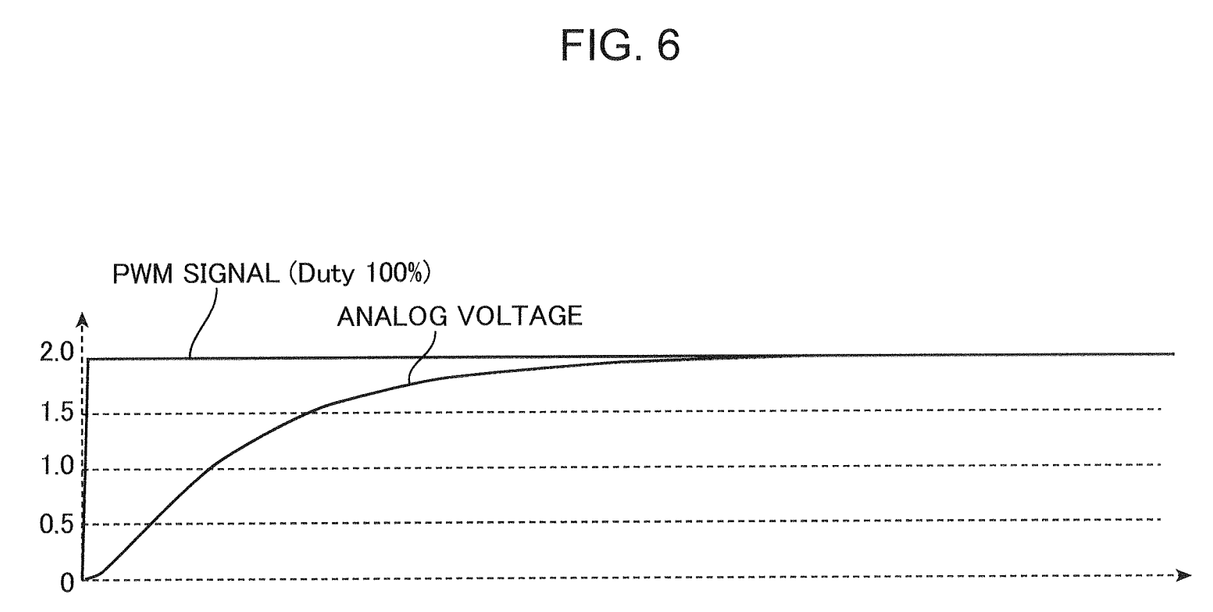
FIG. 6 is a graph showing the relation of the PWM signal, which has a duty ratio of 100%, and the analog voltage.

The relation of the PWM signal as the pulse signal S1 generated by the pulse generating unit 11 and the analog voltage S2 generated by the smoothing unit 12 is now explained. FIG. 5 and FIG. 6 are graphs showing the foregoing relation. The horizontal axis of the graph indicates the time and the vertical axis of the graph indicates the value of the analog voltage S2.

Referring to FIG. 5, the pulse generating unit 11 generates a PWM signal having a duty ratio of 50 percent. Consequently, the analog voltage S2 gradually increases from 0V from the start of generation of the PWM signal, and eventually reaches 1.0 V. The analog voltage S2 generates ripples in correspondence with the cycle of the PWM signal.

Next, referring to FIG. 6, the pulse generating unit 11 generates a PWM signal having a duty ratio of 100 percent. Consequently, the analog voltage S2 gradually increases from 0V from the start of generation of the PWM signal, and eventually reaches 2.0 V. Since the PWM signal has a duty ratio of 100 percent, the periodicity disappears, and becomes a signal of a given magnitude (in other words, a DC signal). Thus, no ripples are generated in the analog voltage S2.

Figure 7:
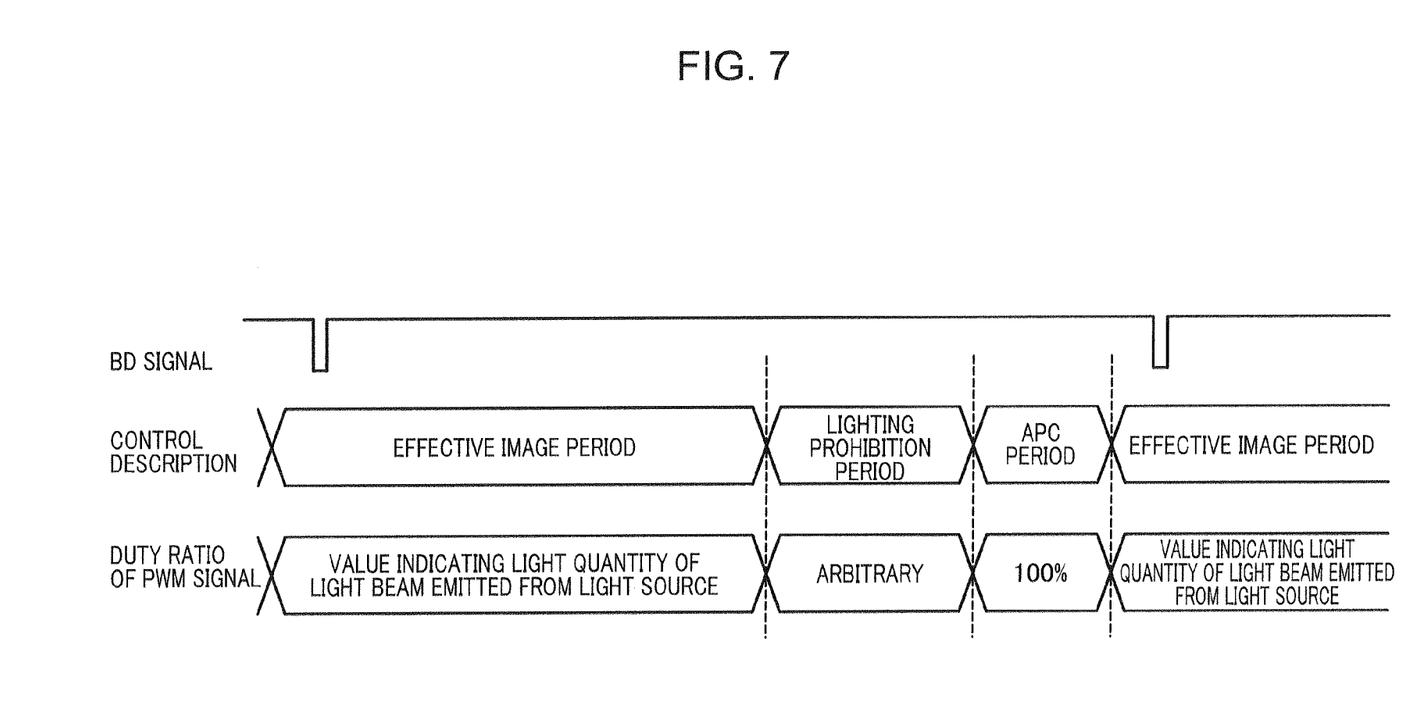
FIG. 7 is a time chart showing the first example of controlling the duty ratio of the PWM signal in this embodiment.
Figure 8:
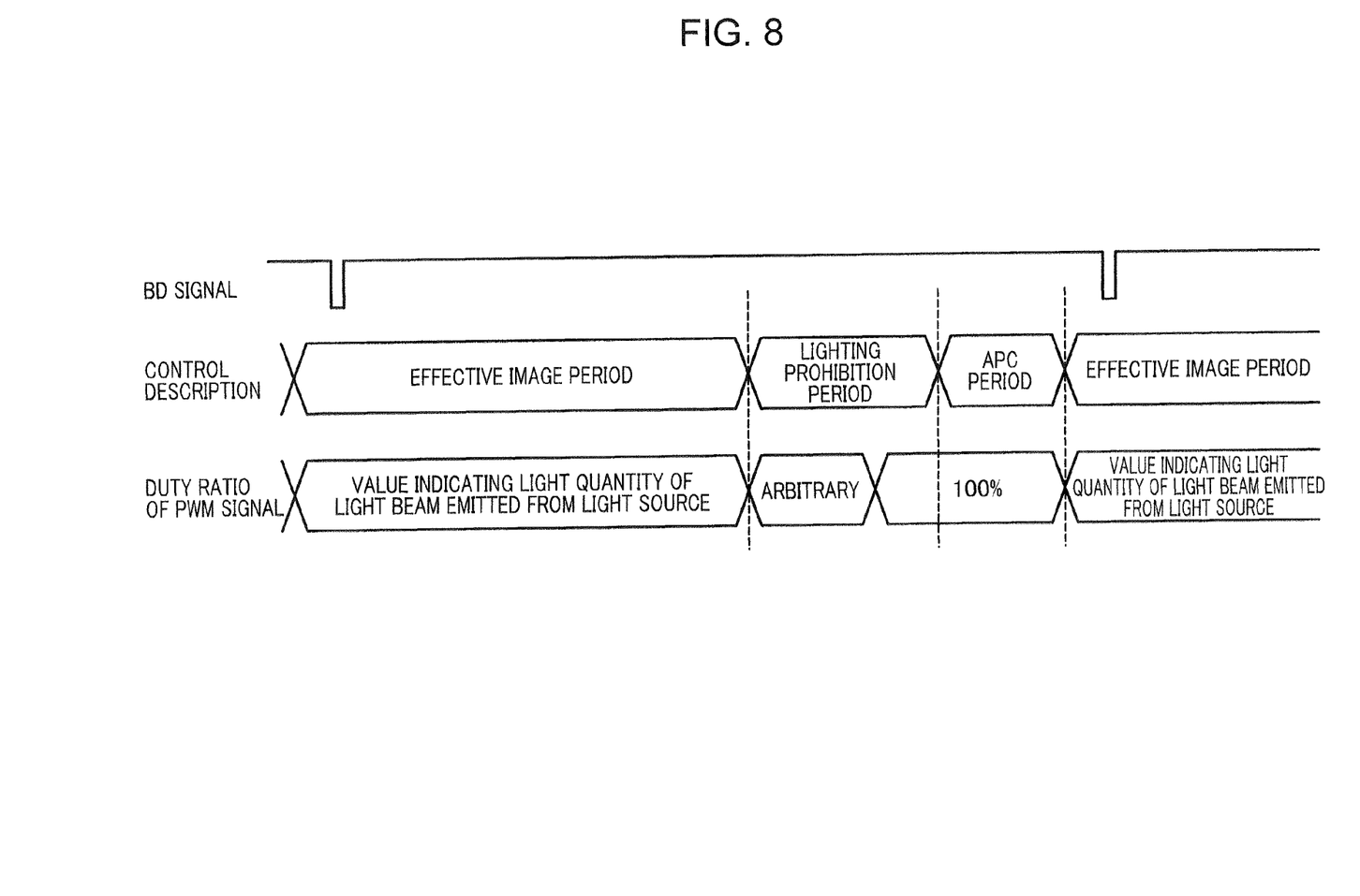
FIG. 8 is a time chart showing the second example of controlling the duty ratio of the PWM signal in this embodiment.

FIG. 7 is a time chart showing the first example of controlling the duty ratio of the PWM signal as the pulse signal S1 generated by the pulse generating unit 11 in this embodiment. FIG. 8 is a time chart showing the second example of controlling the duty ratio of the PWM signal as the pulse signal S1 generated by the pulse generating unit 11 in this embodiment. The period of one main scanning process includes the effective image period, the lighting prohibition period and the APC period. While the period of one main scanning process includes the APC period, the APC is executed every several main scanning processes.

Referring to FIG. 7, in the effective image period, the duty ratio of the PWM signal that the first emitting control unit causes the pulse generating unit 11 to generate is a value indicating the light quantity of the light beam LB to be emitted from the light source 31. In the lighting prohibition period, since the lighting of the light source 31 is prohibited, the duty ratio of the PWM signal is arbitrary. In the entire APC period, the duty ratio of the PWM signal that the second emitting control unit 18 causes the pulse generating unit 11 to generate is 100 percent.

Referring to FIG. 8, in the effective image period, as with FIG. 7, the duty ratio of the PWM signal that the first emitting control unit 17 causes the pulse generating unit 11 to generate is a value indicating the light quantity of the light beam LB to be emitted by the light source 31. In the lighting prohibition period, while the duty ratio of the PWM signal that the second emitting control unit 18 caused the pulse generating unit 11 to generate is initially arbitrary, the duty ratio is switched to 100 percent in mid-course. Note that the duty ratio of the PWM signal may be 100 percent from the beginning of the lighting prohibition period. The second emitting control unit 18 transfers to the APC period while causing the pulse generating unit 11 to continue generating the PWM signal having a duty ratio of 100 percent. In the lighting prohibition period, since the lighting of the light source 31 is prohibited, even if the duty ratio of the PWM signal is switched to 100 percent, no adverse effect will be inflicted on the electrostatic latent image. In the entire APC period as with FIG. 7, the duty ratio of the PWM signal that the second emitting control unit 18 causes the pulse generating unit 11 to generate is 100 percent.

The main effects of this embodiment are now explained. According to this embodiment, as explained in FIG. 7 and FIG. 8, since the pulse generating unit 11 is caused to generate the pulse signal S1 having a duty ratio of 100 percent (in other words, a DC signal) in the APC period, it is possible to prevent the generation of ripples in the analog voltage S2 that is generated by smoothing the pulse signal S1. Thus, accurate APC can be executed.

Note that if the cycle of the pulse signal S1 (PWM signal) is shortened, it is possible to prevent the generation of ripples in the analog voltage S2. Nevertheless, in the foregoing case, the cost of the pulse generating unit 11 (PWM signal generating circuit) will increase. According to this embodiment, it is possible to prevent the generation of ripples in the analog voltage S2 while keeping down the cost of the pulse generating unit 11.

Moreover, as explained in FIG. 7 and FIG. 8, the second emitting control unit 18 causes the pulse generating unit 11 to generate the pulse signal S1 having a duty ratio of 100 percent in the entire APC period. Accordingly, since the duty ratio of the pulse signal S1 does not change during the APC period, it is possible to more reliably prevent the generation of ripples in the analog voltage S2 during the APC period.

In addition, as explained with reference to FIG. 8, the second emitting control unit 18 causes the pulse generating unit 11 to start the generation of the pulse signal S1 having a duty ratio of 100 percent in the lighting prohibition period. Accordingly, since the duty ratio of the pulse signal S1 can be reliably made to be 100 percent at the time of switching to the APC period, it is possible to more reliably prevent the generation of ripples in the analog voltage S2 during the APC period.

Although the present disclosure has been fully described by way of example with reference to the accompanying drawings, it is to be understood that various changes and modifications will be apparent to those skilled in the art. Therefore, unless otherwise such changes and modifications depart from the scope of the present disclosure hereinafter defined, they should be construed as being included therein.

The invention claimed is:
1. An image forming apparatus, comprising:
a photosensitive body;

an exposure unit which includes a light source for emitting a light beam, and causes the light beam emitted from the light source to perform scanning in a main scanning direction, thereby drawing a main scanning line on the photosensitive body;

a pulse generating unit which generates a cyclic pulse signal;

a smoothing unit which smoothes the pulse signal generated by the pulse generating unit thereby generating an analog signal;

a drive current generating unit which generates a drive current of the light source by using the analog signal generated by the smoothing unit;

a first emitting control unit which performs first emitting control of causing the light source to emit the light beam, during an effective image period where the main scanning line drawn on the photosensitive body is treated as an effective image, by causing the pulse generating unit to generate the pulse signal indicating a light quantity of the light beam to be emitted by the light source, causing the smoothing unit to smooth the pulse signal thereby generating the analog signal, and causing the drive current generating unit to generate the drive current based on the analog signal;

a second emitting control unit which performs second emitting control of causing the light source to emit the light beam, in an APC period of automatically controlling the light quantity of the light beam, by causing the pulse generating unit to generate the pulse signal having a duty ratio of 100 percent, causing the smoothing unit to smooth the pulse signal thereby generating the analog signal, and causing the drive current generating unit to generate the drive current based on the analog signal;

a light-receiving unit which receives the light beam emitted from the light source;

a light quantity control unit which causes the light quantity of the light beam emitted by the light source to be identical to the light quantity of the light beam which is indicated by the pulse signal generated by the pulse generating unit in the first emitting control, by controlling a magnitude of the drive current generated by the drive current generating unit based on a signal output from the light-receiving unit in the second emitting control; and a lighting prohibition control unit that causes the light source not to emit the light beam by prohibiting lighting of the light source during a lighting prohibition period between the effective image period and the APC period, wherein the second emitting control unit causes the pulse generating unit to start generating the pulse signal having a duty ratio of 100 percent in the lighting prohibition period.

2. The image forming apparatus according to claim 1, wherein the second emitting control unit causes the pulse generating unit to generate the pulse signal having a duty ratio of 100 percent during the entire APC period.

3. The image forming apparatus according to claim 1, wherein the second emitting control unit causes the pulse generating unit to start generating the pulse signal having a duty ratio of 100 percent in the middle of the lighting prohibition period.

4. The image forming apparatus according to claim 1, wherein the second emitting control unit causes the pulse generating unit to generate the pulse signal having a duty ratio of 100 percent from the beginning of the lighting prohibition period.

5. The image forming apparatus according to claim 1, wherein the smoothing unit is a low-pass filter composed of a capacitor and a resistor.

6. The image forming apparatus according to claim 5, wherein the pulse generating unit generates a PWM signal or a PDM signal as the pulse signal.

7. The image forming apparatus according to claim 6, wherein the light source is a semiconductor laser.

* * * * *